United States Patent [19]

Tressler et al.

[11] Patent Number: 4,798,764

[45] Date of Patent: Jan. 17, 1989

[54] ARSENATE DOPANT SOURCES AND METHOD OF MAKING THE SOURCES

[75] Inventors: Richard E. Tressler, Julian; Herman J. Boeglin, State College, both of Pa.

[73] Assignee: STEMCOR Corporation, Cleveland, Ohio

[21] Appl. No.: 502,262

[22] Filed: Jun. 8, 1983

[51] Int. Cl.$^4$ .................. B05D 3/02; B32B 19/00; B32B 19/04

[52] U.S. Cl. .................. 428/312.6; 156/606; 252/950; 428/312.8; 428/697; 437/168; 437/169

[58] Field of Search .............. 252/950; 148/174, 188; 156/606; 428/697, 312.6, 312.8; 437/168, 169

[56] References Cited

U.S. PATENT DOCUMENTS

| | | | |
|---|---|---|---|
| 1,737,114 | 11/1929 | Heath | 423/602 |
| 3,152,025 | 10/1964 | Kramp | 148/188 UX |
| 3,287,187 | 11/1966 | Rosenheinrich | 148/187 |
| 3,354,005 | 11/1967 | Lepiane et al. | 148/188 X |
| 3,532,563 | 10/1970 | Genser | 148/188 |
| 3,630,793 | 12/1971 | Christensen et al. | 148/188 |
| 3,920,882 | 11/1975 | Venkatu | 252/950 X |
| 3,923,563 | 12/1975 | Venkatu | 252/950 X |
| 4,526,826 | 7/1985 | TenEyck et al. | 428/131 |

FOREIGN PATENT DOCUMENTS

| | | |
|---|---|---|
| 206508 | 5/1926 | Canada . |
| 277392 | 1/1928 | Canada . |
| 290229 | 6/1929 | Canada . |
| 890611 | 2/1944 | France . |
| 1011383 | 6/1952 | France . |

OTHER PUBLICATIONS

Mellor: "A Comprehensive Treatise on Inorganic and Theoretical Chemistry", vol. IX, Longmans, Green & Co., London, 1947, p. 186.

Cotton et al., "Advanced Inorganic Chemistry", p. 383, Third Edition, 1972.

Guerin, et al., "Alkaline Earth Arsenates", C. R. Acad. Sci., vol. 214 (1942) pp. 1004–1006.

Guerin, et al., "Sur L'orthoarseniate Trimagnesiem", Bull. Soc. Chim. Fr., vol. 11 (1970) pp. 3895–3896.

Masson, et al., "Strontium Arsenates", Bull. Soc. Chim. Fr., vols. 11-12, (1977) p. 1077.

*Primary Examiner*—Richard D. Lovering
*Attorney, Agent, or Firm*—George W. Moxon, II; Joseph G. Curatolo; Larry W. Evans

[57] ABSTRACT

New arsenate compounds, compositions and solid diffusion sources for the arsenic doping of semiconductors are disclosed which comprise substances composed of a sintered arsenate that decomposes upon heating at temperatures between 500°–1400° C. to release $As_2O_5$, $As_2O_3$ and/or elemental arsenic vapors for transport to semiconductor elements as a controlled dopant.

16 Claims, No Drawings

ARSENATE DOPANT SOURCES AND METHOD OF MAKING THE SOURCES

FIELD OF THE INVENTION

This invention relates to novel arsenate containing compounds and compositions, to methods of producing them, and to the production of diffusion sources containing arsenate compounds and compositions, which have good thermal stability and diffusion characteristics for utility as n-type impurity dopants for semiconductor elements.

BACKGROUND OF THE INVENTION

Semiconductor elements have multiple applications and utility in the electronics industry and are used in rectifiers, transistors, photodiodes, solar batteries, radiation detectors, charged particle detectors, integrated circuits and various other applications. They have been known in the industry for many years and the term semiconductor element is generally accepted throughout the industry and intended in this application to generically include semiconductor devices and parts thereof formed of host substrates comprising elements, alloys and intermetallic compounds of silicon, germanium, silicon/germanium, gallium arsenide, indium phosphide and the like. Such semiconductor elements can be of any convenient or suitable shape or form but are typically commercially used in the form of circular, rectangular or triangular wafers or disks.

In order to achieve the various electrical rectification characteristics so important to their multiple applications and utilities, semiconductor elements typically have an active impurity incorporated within the host substrate, during manufacture or later by diffusion, which impurity affects the electrical rectification characteristics of the semiconductor element. These active impurities are usually classified as donor impurities or acceptor impurities; the donor impurities including phosphorus, arsenic, antimony, silicon, tellurium, tin and the like; and, the acceptor impurities including boron, gallium, aluminum, zinc, cadmium and the like.

The semiconductor element may have a region thereof containing an excess of donor impurities thus yielding an excess of free electrons. Such region is termed an impurity doped ntype region. Similarly, the semiconductor element may have a region thereof containing an excess of acceptor impurities, which results in a deficit of electrons, such region being termed an impurity doped p-type region. The boundary between such p-type and n-type regions is termed the n-p or p-n junction. In many applications the uniformity of the impurity distribution within the p or n type region, as well as the sharpness of the p-n or n-p junction, is critical to the efficiency of the semiconductor element.

Multiple means have been proposed for incorporating various active impurities in the semiconductor element. Typically, the active impurity may be intimately incorporated during preparation of the host substrate or may be incorporated by deposition on the host substrate during manufacture.

DESCRIPTION OF THE PRIOR ART

The deposition of active impurities at the surface of the host substrate during manufacture typically comprises the high temperature diffusion of vaporized dopant atoms into the body of the host substrate. Typically the diffusion of the doping substance into the host substrate is achieved by heating a predetermined quantity of dopant, together with the host substrate in a closed receptacle in such manner that dopant atoms will permeate the semiconductor body from all or select sides. One method involving deposition of dopants on a limited surface of a semiconductor element is described in U.S. Pat. No. 3,287,187 wherein an oxide of the host substrate material is deposited on the host substrate followed by diffusion of the doping substance into the substrate surface area by heating the host substrate.

U.S. Pat. No. 3,923,563 depicts a typical method of deposition and diffusion wherein porous, rigid dimensionally stable wafers are formed by compacting and sintering refractory oxide powders. The thus formed wafers are then impregnated with dopants such as aluminum metaphosphate, arsenic oxide or antimony oxide by treatment with solutions thereof in suitable organic or aqueous solvents. These wafers function as the source of dopant vapors and are positioned in a suitable furnace in the vicinity of the host substrate. The dopant wafer and host substrate are heated to temperatures between about 850° C. to about 1250° C. wherein the dopant wafer liberates phosphorus, arsenic or antimony oxide vapors which pass through the furnace and contact the host substrate. The vapors appear to react with the hot silicon surface and the elemental phosphorus, arsenic and/or antimony diffuse into the host substrate with continued heating to create the semiconductor element.

OBJECTS OF THE INVENTION

One object of the instant invention is to provide novel solid arsenate diffusion compounds for arsenic doping in the formation of semiconductor elements.

Another object is to provide novel compositions containing arsenate compounds which compositions enhance arsenic doping in the formation of semiconductor elements.

A further object is to provide novel porous arsenic containing dopant wafers and a method of forming such wafers for use in the formation of semiconductor elements.

These and other objects will become apparent from the following description of the invention.

DESCRIPTION OF THE INVENTION

Compounds are disclosed selected from the group consisting of $AlAsO_4$, $YAsO_4$, $Mg_6As_2O_{11}$, $Mg_3As_2O_8$, $Ca_6As_2O_{11}$, $Ca_3As_2O_8$, $Ba_6As_2O_{11}$, $Ba_3As_2O_8$, $Sr_6As_2O_{11}$ and $Sr_3As_2O_8$, which are particularly suitable in providing solid arsenic diffusion sources for the vapor deposition type arsenic doping of semiconductor elements.

Each of the aforesaid compounds undergo controlled decomposition when heated to temperatures between about 500° C. to about 1400° C. releasing $As_2O_5$, $As_2O_3$ and/or elemental arsenic vapors which, when transported to appropriately conditioned host substrates, can effect the controlled arsenic impurity doping thereof in the formation of semiconductor elements. Dopant wafers, comprising at least one of the compounds of the instant invention, have resulted in uniform distribution of arsenic ntype impurities in the formation of semiconductor elements.

It has been discovered that various mixtures of the arsenate compounds of the invention can be utilized to obtain other unexpected effects on dopant characteristics. It has been found that mixtures of the aforesaid compounds, particularly those of the same metallic species, tend to decompose sequentially when heated thus allowing further control of the doping rate. Thus, when mixtures of $Mg_6As_2O_{11}$ and $Mg_3As_2O_8$ are heated, the $Mg_3As_2O_8$ undergoes a relatively rapid reduction to $Mg_6As_2O_{11}$ by giving off arsenates as compared to the similar reduction of $Mg_6As_2O_{11}$. This phenomena can be used as a control factor in varying the rate of the doping process.

The compounds of the instant invention are typically prepared by heating an intimately milled mixture of arsenic pentoxide and a support compound selected from the group consisting of $Al_2O_3$, $Y_2O_3$, MgO, BaO, CaO, SrO or mixtures thereof.

Typically the arsenic pentoxide as well as the magnesium, calcium, barium and strontium oxide support compounds are commercially found combined with water, whereupon it is desirable to dehydrate them prior to intimately mixing. Further, on occasion the magnesium, calcium, barium and strontium support compounds may be commercially found in the form of carbonates in which instance it is necessary to reduce them to the appropriate oxide. In either of the aforesaid instances the appropriate compound can be attained by heating. Generally, when heating the oxide to dehydrate, temperatures in the range of from about 100° C. to about 450° C. are used; when heating to drive off carbon dioxide, temperatures as high as about 1500° C. may be appropriate. Proper safety precautions should always be followed when handling the arsenic compounds.

The arsenic pentoxide is then intimately mixed and/or milled with the support compound, preferably in the absence of water. Though not a requirement of the process, it has been found useful to include a substantially non-reactive hygroscopic agent such as acetone in the mixture to assure a thorough mixing of the arsenic pentoxide with the support compound. In the case of $Al_2O_3$ and $Y_2O_3$, support compounds, the mixture is preferably maintained at about 1:1 mole ratio of arsenic pentoxide to support compound; when MgO, CaO, BaO and SrO are the support compounds, the mixture is preferably maintained at about 1:3 or 1:6 of arsenic pentoxide to support compound, depending upon the final compound to be produced. The mixing and/or milling can be conveniently done in a ball mill taking appropriate safety precautions because of the extremely toxic nature of the arsenic oxides being processed. Ball milling and/or mixing of up to about 35 hours will usually provide appropriate intimate mixing of the arsenic pentoxide and support compound.

After the arsenic pentoxide and support compounds have been thoroughly mixed and/or milled, they can be subjected to heating to produce the compounds of the invention. Generally the mixture is heated to temperatures from about 250° C. to about 1200° C for a time sufficient to produce the desired product. It should be noted that the time necessary for heating is dependent upon the amount of material being processed and the processing temperature.

It has been found that the cyclic application of heat can result in a purer final product. When the support compounds are $Al_2O_3$ and/or $Y_2O_3$, it is preferred to heat the mixtures to between about 250° C. and 350° C.; hold the mixture at that temperature range for about 10 to about 14 hours, then slowly heat to between about 500° C. and 600° C. The mixture is held at that temperature range for about 2 to about 4 hours then heated to between about 800° C. and 1000° C. and held at that range for about 12 to about 30 hours. When the support compounds are MgO, Cao, BaO or SrO, and the mole ratio is 1:3 arsenic pentoxide to support compound, it is preferred to slowly heat the mixture to between about 600° and 700° C., hold that temperature range for about 8–16 hours; slowly heat to between about 900° and 1000° C. and hold that temperature for about 6–10 hours. When the mole ratio is 1:6, the heating cycle is the same as the 1:3 ratio but the temperature ranges change to between about 250° C. and 350° C., then to between about 1100° C. and 1200° C.

Generally, the compounds produced by the aforedescribed process are recovered as a solid mass. Though they can be utilized as dopants in such form, it is generally desirable to crush them to a loose particulate form for convenience in handling and subsequent treatment. Though particle size is in many applications not critical, in other applications it has been found particularly convenient to limit particle size to from about 1 micron to about 150 microns.

The dopant compounds can be effectively utilized as vapor deposition dopants in their loose particle form, in solution, suspension, as deposits on skeletal support structures or as integrally molded structures. The prior art is replete with various methods of utilizing dopants of the nature of the compounds of the invention in loose particulate form and as deposits on various skeletal supports such as ceramic, glass or similar dopant support structures. Generally, the compounds of this invention can be used with any of the appropriate methods and support structures of the prior art. One support structure which is particularly preferred when utilizing the dopant compounds of the invention is described in copending application U.S. Pat. No. 4,526,826 the discussion thereof which is herewith incorporated by reference.

One particularly important advantage of the particulate compounds of the invention is that they can themselves be easily molded into virtually any suitable form using virtually any binder and thereafter sintered, thus becoming a refractory formed dopant of controlled porosity having superior thermal shock resistance.

Typical binders which have been found useful for molding the particulate compounds of the invention into suitable form include organic binders such as starches, dextrines, gums, flours, casein, gelatins, albumins, proteins, lignins, cellulosics, bitumens, rubbers, alginates, waxes and the like; synthetic resins such as vinyls, acrylics, wax emulsions, paraffin, cellulosics, glycols, epoxies, phenolics and the like; and inorganic binders such as silicates, colloidal silica, colloidal alumina, colloidal aluminates, colloidal silicates and the like.

In certain instances, various additive compounds may be included with the particulate compounds of the invention for purposes such as accelerating sintering or improving the mechanical or thermal strength of the moldings. In such instance, it is important that the amount and type of such additive compound be controlled so that it does not adversely affect the arsenate vaporization or contribute non-desirable diffusable impurities which adversely affect or otherwise undesirably influence the electrical properties of the semiconductor element.

The additive compounds can be granular or fibrous in shape. Though not generally necessary, fibrous additives have been found effective in enhancing the thermal shock resistance of molded wafers. Granular decomposable additives have been found effective in increasing the porosity of the sintered wafers.

In a preferred embodiment, improved dopant wafer structural integrity has been achieved by the addition of silica in the form of colloidal silica, crystalline silica or silicic acid. Small amounts, 10% or less are preferred, however, greater amounts can be used providing it does not adversely affect dopant vaporization. Though applicants do not wish to be limited thereby, it appears that the silicic acid affects the structural integrity during the sintering process which results in an interconnected porosity such that the available surface area, from which diffusion from the dopant wafer takes place, increases and can result in both increased life and efficiency of the wafer. It should be understood, however, that though various additives can be utilized in the practice of this invention, it has generally been found that the compounds themselves are so superior that further additives are unnecessary.

In the formation of solid dopant wafers, the crushed, particulate compound of the invention is mixed with a binder as before described, with or without an appropriate additive, then compacted into a suitable die such as a steel mold or the like. Compacting the compound/binder mixture is necessary in that it compresses the particulate mixture to an appropriate green density for sintering. Typically, compressing the mixture in the die to a range of between about 1,000 psi to about 10,000 psi is sufficient to obtain an appropriate green density. It should be understood, however, that the pressure necessary for compacting is dependent upon the binder and varies accordingly. The thus compacted and formed mixtures can then be sintered by heating to between about 700° and 1400° C.

The solid dopant can be formed in any convenient size and shape, but usually it is formed in substantially the same size and shape as the semiconductor element it will be doping. One advantage of the compounds of the instant invention is that they may be molded, compacted and sintered into rods, etc., which thereafter can be cut into wafers, disks, etc., rather than pressing each wafer, disk, etc., individually. It has been found that wafers produced using the compounds of this invention retain their form when subjected to vapor deposition conditions, at temperatures from about 500° C. to about 1400° C., with the semiconductor element.

The following examples are provided to illustrate the invention and are not meant as a limitation thereof. All temperatures are in degrees centigrade unless otherwise indicated.

EXAMPLE 1

337 grams of anhydrous calcium oxide and 230 grams of anhydrous arsenic pentoxide, each having an average particle size of about 45 microns are intimately mixed and milled at room temperature, or a laboratory ball mill for 5 hours. The mixture is slowly heated over a period of one hour to 300° C. and maintained at that temperature for 12 hours. The heated mixture is then slowly heated over a period of one hour, to 1,150° C. and maintained at that temperature for 8 hours. The resulting product is a porous cake comprising $Ca_6As_2O_{11}$.

In a similar manner 622 grams of strontium oxide or 920 grams of barium oxide are mixed and milled with 230 grams of arsenic oxide, and thereafter cyclically heated to, and maintained at, 300° C. and 1,150° C. Porous cakes comprising $Sr_6As_2O_{11}$ or $Ba_6As_2O_{11}$ respectively are recovered.

EXAMPLE 2

50 grams of particulate $Mg_3As_2O_8$, having an average particle size less than 40 microns, and 50 grams of particulate $Mg_6As_2O_{11}$, having an average particle size of less than 150 microns, were intimately mixed by mortar and pestle with 10.4 grams of an aqueous solution containing 10% by weight polyvinyl alcohol, 0.5% by weight of polyethylene glycol (viscosity 200 cps) and the remainder water. The resulting moistened mass was dried by heating in a vented oven at 60° C. for 2 hours and thereafter screened at 80 mesh to obtain a material having a particle size of less than 200 microns. 8.5 grams of the aforedescribed screened paticulate material was formed into a 3 inch round wafer by pressing the material into an appropriate die at 5,000 psi. The thus formed wafer was heated and maintained at a temperature of 100° C. for 1 hour to assure drying. The formed and dried wafer was then fired in a vented kiln by slowly heating, over a period of 1 hour, to 1,225° C. and maintained at that temperature for 4 hours. The thus fired product was cooled to room temperature and upon visual inspection was found to have maintained its structural integrity with no visible warping or deformation of the wafer from its original formed and pressed configuration.

In a similar manner, 50 grams of particulate $Ba_3As_2O_8$ and 50 grams of particulate $Ba_6As_2O_{11}$; 50 grams of $Sr_3As_2O_8$ and 50 grams of $Sr_6As_2O_{11}$ are mixed and milled with 10.4 grams of the aforesaid aqueous solution, formed, pressed and kiln fired to produce dopant wafers which do not show deformation such as warping or swelling, and retain their smooth, porous surface when utilized to dope semiconductor elements in a diffusion furnace.

EXAMPLE 3

100 grams of $AlAsO_4$, having an average particle size of 50 microns, 122 milliliters of de-ionized water, 1.5 grams of ammonium alginate, 1.0 grams of styrene maleic anhydride copolymer and 0.7 grams of ammonium carboxylate were intimately mixed and milled, at room temperature, on a laboratory ball mill for 2 hours to form an intimately mixed slurry. A 3 inch diameter silicon carbide formed wafer, formed by impregnating a 3 inch diameter, 60 mil thick reticulated polyurethane foam, having about 100 pores per inch, with a 70% aqueous SiC slurry, drying, infiltrating with powdered (500 micron) metallic silicon and thereafter firing at 1550° C. for 15 minutes in accord with copending application U.S. Pat. No. 4,526,826 was impregnated with the aforesaid slurry by immersion and vacuum filtration through the wafer. The thus impregnated wafer was fired in a kiln, in an oxygen atmosphere, at 950° C. for 3 hours. The oxygen atmosphere assured the decomposition of binder components. The aforesaid prepared dopant source wafer was heated in a diffusion oven with a single crystal silicon host substrate semiconductor element for 6 hours at 1000° C. in a nitrogen atmosphere. The resultant arsenic doped semiconductor element was etched with a 10% aqueous hydrofluoric acid solution and tested in accordwith ASTM F43-78 to determine sheet resistivity. ASTM F43-78 defines a 4 point probe technique for ascertaining the ratio of potential gradient parallel to the current in the material to the current density. The element was confirmed to have a uniform n-type region and found to have a sheet resistivity of 40 ohms/square. The used arsenate containing dopant wafer did not show deformation such as bending or swelling and retained its smooth porous surface.

In a similar manner, $YAsO_4$ dopant wafers are produced which do not show deformation such as bending or swelling when utilized to dope semiconductor elements in a diffusion furnace.

EXAMPLE 4

An arsenate containing dopant wafer prepared in accord with Example 2 was heated in a diffusion oven with a single crystal silicon host substrate semiconductor element for 0.5 hours at 1,200° C. in a nitrogen atmosphere. The resulting arsenate dopant semiconductor element was etched with a 10% aqueous hydrofluoric acid solution and tested in accord with ASTM F43-78. The element was confirmed to have a uniform n-type region and found to have a sheet resistivity of 40 ohms/square. The used arsenate containing dopant wafer did not show deformation such as bending or swelling and retained its smooth porous surface.

EXAMPLE 5

Dopant wafers were prepared by the method of Example 2, with the exception that 25 grams of $Mg_3As_2O_8$ and 75 grams of $Mg_6As_2O_{11}$ were utilized. The aforesaid prepared dopant wafers were heated in a diffusion oven with a single crystal silicon host substrate semiconductor element for 3 hours at 1,100° C. or 0.5 hours at 1,249° C. in the presence of a nitrogen atmosphere. After etching with 10% aqueous hydrofluoric acid solution the semiconductor elements were tested in accord with ASTM F43-78. Each of the semiconductor elements was confirmed to have a uniform n-type region and found to have sheet resistivity of $510 \pm 10\%$ ohms/square and $88 \pm 10\%$ ohms/square respectively. The used arsenate containing dopant wafers did not show deformation such as bending or swelling and retained their smooth porous surface.

EXAMPLE 6

100 grams of $Mg_3As_2O_8$, having an average particle size of 50 microns, 122 milliliters of de-ionized water, 1.5 grams of ammonium alginate, 1.0 grams of styrene maleic anhydride copolymer and 0.7 grams of ammonium carboxylate were intimately mixed and milled, at room temperature, on a laboratory ball mill for 2 hours to form an intimately mixed slurry. 3 inch diameter silicon carbide foamed wafers, formed in accord with Example 3, were impregnated with the aforesaid slurry by immersion and vacuum filtration through the wafer. The thus impregnated wafers were fired in a kiln, in a oxygen atmosphere, at 1,200° C. for 1 hour. The oxygen atmosphere assured the decomposition of binder components. The aforesaid prepared dopant source wafers were heated in a diffusion oven with a single crystal silicon host substrate semiconductor element for 6 hours at 1,200° C. in a 95% nitrogen+5% oxygen atmosphere or for 100 hours at 1,200° C. in a 90% nitrogen+10% oxygen atmosphere. The resultant arsenic doped semiconductor elements were etched with a 10% aqueous hydrofluoric acid solution and tested in accord with ASTM F43-78 to determine sheet resistivity. The elements were confirmed to have a uniform n-type region and found to have a sheet resistivity of $550 \pm 10\%$ ohms/square and $50 \pm 10\%$ ohms/square respectively.

The used arsenate containing dopant wafers did not show deformation such as bending or swelling and retained their smooth surface.

We claim:

1. A dopant source for the vapor phase transport of arsenic dopant at elevated temperature comprising at least one compound of the group consisting of $AlAsO_4$, $YAsO_4$, $Mg_6As_2O_{11}$, $Mg_3As_2O_8$, $Ca_6As_2O_{11}$, $Ca_3As_2O_8$, $Ba_3As_2O_8$, $Ba_6As_2O_{11}$, $Sr_6As_2O_{11}$, and $Sr_3As_2O_8$, said compounds disassociating in the temperature range 500° C. to 1400° C. to release arsenic oxide vapors, wherein said compound is in solution.

2. A dopant source for the vapor phase transport of arsenic dopant at elevated temperature comprising at least one compound of the group consisting of $AlAsO_4$, $YAsO_4$, $Mg_6As_2O_{11}$, $Mg_3As_2O_8$, $Ca_6As_2O_{11}$, $Ca_3As_2O_8$, $Ba_3As_2O_8$, $Ba_6As_2O_{11}$, $Sr_6As_2O_{11}$, and $Sr_3As_2O_8$, said compounds disassociating in the temperature range 500° C. to 1400° C. to release arsenic oxide vapors, wherein said compound is in suspension.

3. A dopant source for the vapor phase transport of arsenic dopant at elevated temperature comprising at least one compound of the group consisting of $AlAsO_4$, $YAsO_4$, $Mg_6As_2O_{11}$, $Mg_3As_2O_8$, $Ca_6As_2O_{11}$, $Ca_3As_2O_8$, $Ba_3As_2O_8$, $Ba_6As_2O_{11}$, $Sr_6As_2O_{11}$, and $Sr_3As_2O_8$, said compounds disassociating in the temperature range 500° C. to 1400° C. to release arsenic oxide vapors, wherein said compound is deposited on a rigid, porous support structure.

4. A dopant source for the vapor phase transport of arsenic dopant at elevated temperature comprising at least one compound of the group consisting of $AlAsO_4$, $YAsO_4$, $Mg_6As_2O_{11}$, $Mg_3As_2O_8$, $Ca_6As_2O_{11}$, $Ca_3As_2O_8$, $Ba_3As_2O_8$, $Ba_6As_2O_{11}$, $Sr_6As_2O_{11}$, and $Sr_3As_2O_8$, said compounds disassociating in the temperature range 500° C. to 1400° C. to release arsenic oxide vapors, wherein said compound comprises a porous refractory dopant structure.

5. The dopant source of claim 1, 2, 3 or 4 comprising a mixture of $Mg_6As_2O_{11}$ and $Mg_3As_2O_8$.

6. The dopant source of claim 1, 2, 3, or 4 comprising a mixture of $Ca_6As_2O_{11}$ and $Ca_3As_2O_8$.

7. The dopant source of claim 1, 2, 3 or 4 comprising a mixture of $Ba_6As_2O_{11}$ and $Ba_3As_2O_8$.

8. The dopant source of claim 1, 2, 3 or 4 comprising a mixture of $Sr_6As_2O_{11}$ and $Sr_3As_2O_8$.

9. The dopant source of claim 1, 2, 3 or 4 comprising a mixture of $AlAsO_4$ and $YAsO_4$.

10. The dopant source of claim 4 in the form of a wafer or disk.

11. The method of preparing the compounds of the group consisting of $AlAsO_4$, $YAsO_4$, $Mg_6As_2O_{11}$, $Mg_3As_2O_8$, $Ca_6As_2O_{11}$, $Ca_3As_2O_8$, $Ba_3As_2O_8$, $Ba_6As_2O_{11}$, $Sr_6As_2O_{11}$, and $Sr_3As_2O_8$, comprising heating arsenic pentoxide in the presence of a compound selected from the group consisting of $Al_2O_3$, $Y_2O_3$, MgO, BaO, CaO, SrO and mixtures thereof.

12. The method of claim 11 wherein said compounds are intimately mixed and milled.

13. The method of claim 11 wherein the mole ratio of MgO, BaO, CaO, SrO or mixtures thereof to arsenic pentoxide is about 3:1 or about 6:1.

14. The method of claim 11 wherein the compounds are heated to temperatures from about 250° C. to about 1200° C.

15. The method for forming a porous refractory dopant source comprising combining at least one compound of the group consisting of $AlAsO_4$, $YAsO_4$, $Mg_6As_2O_{11}$, $Mg_3As_2O_8$, $Ca_6As_2O_{11}$, $Ca_3As_2O_8$, $Ba_3As_2O_8$, $Ba_6As_2O_{11}$, $Sr_6As_2O_{11}$, and $Sr_3As_2O_8$, with a binder, compacting said combination and thereafter sintering said combination by heating to a temperature between about 500° C. and 1400° C. until a solid, porous refractory structure is obtained.

16. The method of claim 15 wherein silicic acid is added thereto.

* * * * *